United States Patent
Majima et al.

(10) Patent No.: US 8,996,324 B2
(45) Date of Patent: Mar. 31, 2015

(54) BATTERY-STATE MONITORING APPARATUS

(75) Inventors: Yoshihide Majima, Tokyo (JP);
Mitsuhiro Takahashi, Tokyo (JP);
Kazuhiko Takeno, Kanagawa (JP);
Haruo Uemura, Kumamoto (JP);
Yasuyuki Kanai, Tokyo (JP); Takayuki Kanai, Kanagawa (JP)

(73) Assignees: Mitsumi Electric Co., Ltd., Tokyo (JP);
NTT DOCOMO, INC., Tokyo (JP)

( * ) Notice: Subject to any disclaimer, the term of this patent is extended or adjusted under 35 U.S.C. 154(b) by 155 days.

(21) Appl. No.: 13/003,326

(22) PCT Filed: Jul. 7, 2009

(86) PCT No.: PCT/JP2009/062355
§ 371 (c)(1),
(2), (4) Date: Jan. 10, 2011

(87) PCT Pub. No.: WO2010/004984
PCT Pub. Date: Jan. 14, 2010

(65) Prior Publication Data
US 2011/0119005 A1    May 19, 2011

(30) Foreign Application Priority Data
Jul. 11, 2008  (JP) ................. 2008-181923

(51) Int. Cl.
*G01R 31/36*  (2006.01)
*G01N 27/416*  (2006.01)
*H01M 10/42*  (2006.01)
*H01M 10/48*  (2006.01)

(52) U.S. Cl.
CPC ........... *H01M 10/425* (2013.01); *G01R 31/361* (2013.01); *G01R 31/3648* (2013.01); *H01M 10/48* (2013.01); *H01M 10/486* (2013.01)
USPC ............................. 702/63; 324/426

(58) Field of Classification Search
CPC ...... H04W 52/0261; H04W 52/28; H02J 7/00; G01R 36/00; G01R 31/361; G01R 31/3648; H01M 10/486; H01M 10/48; H01M 10/425
USPC .......... 702/63, 64, 65, 67, 85, 130, 182, 183, 702/184, 189, 193; 320/132; 324/426
See application file for complete search history.

(56) References Cited

U.S. PATENT DOCUMENTS 4,163,186 A * 7/1979 Haley ....................... 340/636.15
4,965,738 A   10/1990 Bauer et al.
(Continued)

FOREIGN PATENT DOCUMENTS

JP    03-285522    12/1991
JP    09-247852    9/1997
(Continued)

OTHER PUBLICATIONS

Chinese Office Action mailed Nov. 5, 2012 with English translation.

*Primary Examiner* — Eliseo Ramos Feliciano
*Assistant Examiner* — Yoshihisa Ishizuka
(74) *Attorney, Agent, or Firm* — IPUSA, PLLC (57) ABSTRACT

A battery-state monitoring apparatus includes: a secondary battery 200 supplying an electric power to portable equipment 300; and an operation processing part 50 that can detect a battery state of the secondary battery 200 in a detection mode to detect the battery state of the secondary battery 200, the operation processing part using the secondary battery 200 as a power source, wherein the battery-state monitoring apparatus includes a start-up current detecting part 31 detecting a start-up of the portable equipment 300, and wherein the operation processing part 50 waits for a detection of the battery state in a standby mode in which power consumption is smaller than the detection mode until the start-up is detected by the start-up current detecting part 31, and, on the other hand, the operation processing part 50 detects, by intermittently performing a temporary return from the standby mode to the detection mode, the battery state of the secondary battery in a return period during which the return is made.

4 Claims, 6 Drawing Sheets

(56) References Cited

U.S. PATENT DOCUMENTS

| | | | |
|---|---|---|---|
| 6,212,410 B1 | 4/2001 | Ishida | |
| 2004/0204174 A1* | 10/2004 | Pehrsson | 455/572 |
| 2007/0170892 A1* | 7/2007 | Ishii | 320/132 |
| 2008/0111520 A1* | 5/2008 | Sasaki | 320/134 |

FOREIGN PATENT DOCUMENTS

| | | |
|---|---|---|
| JP | 2001-231179 | 8/2001 |
| JP | 3217007 | 8/2001 |
| JP | 2008-125268 | 5/2008 |
| WO | WO01/17053 | 3/2001 |

* cited by examiner

BATTERY-STATE MONITORING APPARATUS

TECHNICAL FIELD

The present invention relates to a battery-state monitoring apparatus, which is provided with a state detection part for detecting a battery state of a secondary battery for supplying electric power to an electric load, the detection part using the secondary battery as a power source.

BACKGROUND ART

It is known that an open circuit voltage characteristic, which indicates a relationship between a state of charge and an open voltage, as one of characteristics of a secondary battery, is maintained as substantially the same open circuit voltage characteristic irrespective of deterioration of the secondary battery or changes in use condition (for example, refer to patent document 1). Using this characteristic, the patent document 1 discloses a battery capacity detecting method of assuming a state of charge at a time of measurement based on an open voltage measured during a charge or discharge stop period and an open circuit voltage characteristic. Further, patent document 1 discloses a method of estimating a full charge capacity of a secondary battery based on states of charge before charge start and after charge end and an amount of charged electric power supplied to the secondary battery during the charge, and also a method of estimating an amount of charge remaining in the second battery after charge is ended based on a state of charge after charge end and a full charge capacity.

PRIOR ART DOCUMENT

Patent Document

Patent Document 1: Japanese Laid-Open Patent Application No. 2001-231179

SUMMARY OF THE INVENTION

Problem to be Solved by the Invention

In the meantime, if a state detecting part for detecting a battery state (for example, a remaining amount of charge or a state of charge) of a secondary battery, which supplies electric power to an electric load such as an electronic equipment, is operated by the secondary battery as a power source, the amount of charge of the secondary battery necessary to be maintained for an electric load is reduced in no small measure due to power consumption associated with the operation of the state detecting part. In order to suppress the reduction in the amount of charge of the secondary battery due to the power consumption of the state detecting part, the power consumption of the state detecting part may be reduced by limiting the operation of the battery state by the state detecting part until the electric load is started up. However, the detection accuracy of the battery state goes down because the period for limiting the detecting operation for the battery state becomes long as the time until the start-up of the electric load increases.

Thus, it is an object of the present invention to provide a battery-state monitoring apparatus, which can accurately detect a battery state while suppressing reduction of a remaining amount of charge of a secondary battery.

Means to Solve the Problems

In order to achieve the above-mentioned object, a battery-state monitoring apparatus according to the present invention comprises:

a secondary battery supplying an electric power to an electric load; and a state detecting part detecting a battery state of said secondary battery in a detection mode to detect the battery state of said secondary battery, the state detecting part using said secondary battery as a power source, wherein said battery-state monitoring apparatus includes a start-up detecting part detecting a start-up of said electric load, and wherein said state detecting part waits for a detection of said battery state in a standby mode in which a power consumption is smaller than said detection mode until said start-up is detected by said start-up detecting part, and, on the other hand, said state detecting part detects, by intermittently performing a temporary return from said standby mode to said detection mode, said battery state in a return period during which said return is made.

Here, it is preferable that said state detecting part detects a remaining amount of charge of said secondary battery as said battery state.

Additionally, it is preferable that said state detecting part detects, during said return period, the remaining amount of charge of said secondary battery by subtracting an integration value from said remaining amount of charge detected in said detection mode prior to said return period, the integration value acquired by integrating a current consumption value of said electric load with a standby time to standby in said standby mode after the detection mode.

Additionally, it is preferable that the current consumption value of said electric load is stored in a memory. Additionally, if, in association with the start-up of said electric load, said start-up detecting part detects as said start-up a fluctuation in a current generated in a power supply path between said electric load and said secondary battery, said start-up detecting part may detect also the current consumption value of said electric load.

Additionally, it is preferable that, in association with the start-up of said electric load, said start-up detecting part detects as said start-up a fluctuation of a current or a voltage generated in a power supply path between said electric load and said secondary battery, and also detects the current consumption value of said electric load.

Effect of the Invention

According to the present invention, the battery state can be detected accurately while suppressing reduction of a remaining amount of charge of the secondary battery.

MODE FOR CARRYING OUT THE INVENTION

A description will be given below, with reference to the drawings, of a best mode for carrying out the invention.

Figure 1:
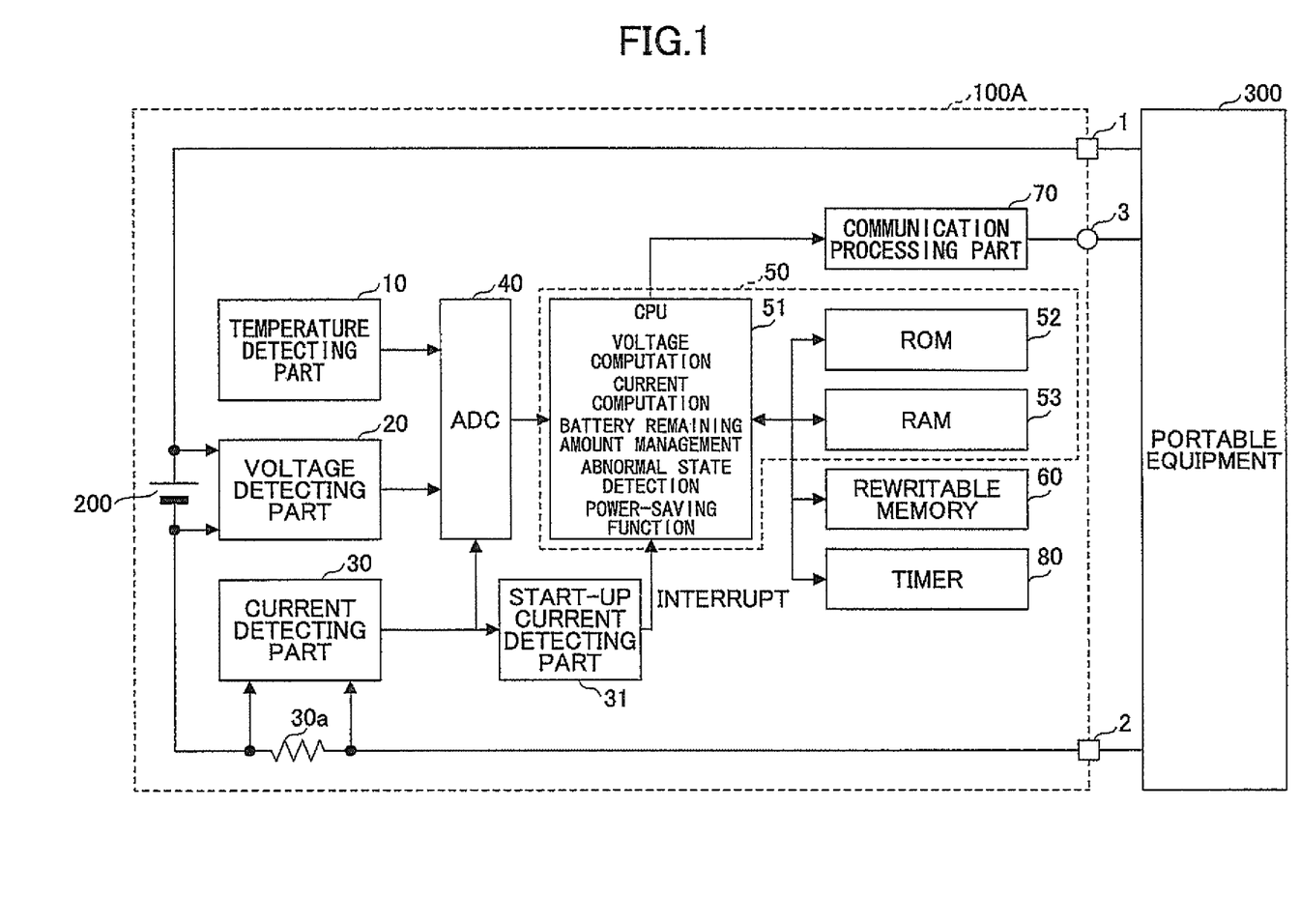
FIG. 1 is an overall structure diagram of an intelligent battery pack 100A, which is a first embodiment of a battery-state monitoring apparatus according to the present invention.

FIG. 1 is an overall structure diagram of an intelligent battery pack 100A, which is a first embodiment of a battery-state monitoring apparatus according to the present invention. The battery pack 100A includes: a temperature detecting part 10 that detects an ambient temperature of a secondary battery 200 such as a lithium ion battery, a nickel hydrogen battery, an electric double-layer capacitor or the like; a voltage detecting part 20 that detects a voltage of the secondary battery 200; a current detecting part 30 that detects a charge and discharge current of the secondary battery 200; an AD converter (hereinafter, referred to as ADC) 40 that converts an analog voltage value, which is output from each detecting part and indicates a result of detection, into a digital value; an operation processing part 50 (for example, a microcomputer provided with a CPU 51, a ROM 52, a RAM 53, etc.) that performs computation processing such as a current integration, a capacity correction, a computation of a dischargeable amount;
a memory 60 (for example, an EEPROM or a flash memory) that stores characteristics data that specifies a characteristic of each of structure parts such as the secondary battery 200 or the battery pack used for the computation process; a communication processing part 70 (for example, a communication IC) that transmits battery-state information regarding the secondary battery 200 to the portable equipment 300, which uses the secondary battery 200 as a power source; a timer 80 that manages time; and a start-up current detecting part 31 that detects a start-up current of the portable equipment 300 in accordance with a result of detection of the current detecting part 30. Some or all of those structure elements may be packaged by being constituted by integrated circuits.

The secondary battery 200 is a power source of the portable equipment 300, and is also a power source of the ADC 40, the operation processing part 50, the communication processing part 70, and the timer 80. Moreover, with respect to the temperature detecting part 10, the voltage detecting part 20, the current detecting part 30 and the start-up current detecting part 31, an electric power supplied from the secondary battery 200 may be needed according to the circuit structures of those parts. With respect to the memory 60, the contents of the memory are maintained even when a power supply from the secondary battery 200 is interrupted. The temperature detecting part 10, the voltage detecting part 20, the current detecting part 30, the ADC 40 and the operation processing part 50 function as a state detecting part to detect a battery state of the secondary battery 200.

The battery pack 100A is a modular component which is a combination of the secondary battery 200 and a management system that manages a battery state of the secondary battery 200. The battery pack 100A is connected to the portable equipment 300 through electrode terminals (a positive-electrode terminal 1 and a negative-electrode terminal 2) and a communication terminal 3. The positive-electrode terminal 1 is electrically connected to a positive electrode of the secondary battery 200 through a power supply path, and the negative-electrode terminal 2 is electrically connected to a negative electrode of the secondary battery 200 through a power supply path. The communication terminal 3 is connected to the communication processing part 70. The portable equipment 300 is an electronic equipment which a person can carry, and, specifically may be a cellular phone, an information terminal apparatus such as a PDA, a mobile personal computer, etc., a camera, a game machine, a music or video player, etc. The battery pack 100A may be incorporated in the portable equipment 300 or externally attached to the portable equipment 300.

The temperature detection part 10 detects an ambient temperature of the secondary battery 200, and outputs the detected ambient temperature to the ADC 40 after converting it into a voltage, which can be input to the ADC 40. The digital value of the battery temperature indicating the ambient temperature of the secondary battery 200 converted by the ADC 40 is transmitted to the operation processing part 50, and used as a parameter for operation processing. Moreover, the digital value of the battery temperature is converted into a previously determined unit by the operation processing part 50, and is output to the portable equipment 300 through the communication processing part 70 as battery-state information indicating a battery state of the secondary battery 200. It should be noted that the temperature detecting part 10 may be one that detects not only a temperature of the secondary battery 200 or an ambient temperature of the secondary battery but also a temperature of the battery pack 100A or a structure part thereof if the battery pack 100A is close to the secondary battery 200. Additionally, in a case where the temperature detecting part 10 is constituted by an integrated circuit together with the voltage detecting part 20, the current detecting part 30 and the ADC 40, the temperature detecting part 10 can detect a temperature of the integrated circuit itself or an ambient temperature of the integrated circuit.

The voltage detecting part 20 detects a voltage of the secondary battery 200, and outputs the detected voltage to the ADC 40 after converting it into a voltage, which can be input to the ADC 40. The digital value of the battery voltage indicating the voltage of the secondary battery 200 converted by the ADC 40 is transmitted to the operation processing part 50, and used as a parameter for operation processing. Moreover, the digital value of the battery voltage is converted into a previously determined unit by the operation processing part 50, and is output to the portable equipment 300 through the communication processing part 70 as battery-state information indicating a battery state of the secondary battery 200.

The current detecting part 30 detects a charge and discharge current of the secondary battery 200, and outputs the detected current to the ADC 40 after converting it into a voltage, which can be input to the ADC 40. The current detecting part 30 is provided with a current detection resistor 30a connected to the secondary battery 200 in series and an operation amplifier, which amplifies a voltage generated at an opposite ends of the current detecting resistor 30a, in order to convert the charge and discharge current into a voltage by the current detection resistor 30a and the operation amplifier. The operation amplifier may be provided to the ADC 40. The digital value of the battery current indicating the charge and discharge current of the secondary battery 200 converted by the ADC 40 is transmitted to the operation processing part 50, and used as a parameter for operation processing. Moreover, the digital value of the battery current is converted into a previously determined unit by the operation processing part 50, and is output to the portable equipment 300 through the communication processing part 70 as battery-state information indicating a battery state of the secondary battery 200.

The operation processing part 50 can compute an amount of electric power charged and discharged at the secondary battery 200 and also can compute a present amount of electric power (a remaining amount of charge) accumulated in the secondary battery 200 by integrating the current value detected by the current detecting part 30 in a charging state or a discharging state (for example, a state where a current equal to or larger than a predetermined value is consumed by an operation of the portable equipment 300) of the secondary battery 200. With respect to computation of the remaining amount of charge, Japanese Laid-Open Patent Application No. 2004-226393 discloses an idea in that, if a condition such as a temperature or a current is changed in a charge and discharge of a secondary battery, a charge and discharge efficiency is not changed but electric power, which is temporarily not charged or discharged, in accordance with each charge and discharge condition and an amount of such electric power is changed. According to this idea, there is no need to perform a correction process with respect to the charge and discharge efficiency. However, if a temperature dependent circuit part, which depends on a temperature, exists in a structure part of the battery pack 100A, the operation processing part 50 may detect an ambient temperature by the temperature detecting part 10 in order to correct a charge and discharge current value of the secondary battery 200 converted by the ADC 40 based on the "charge and discharge current—temperature" characteristic. The "charge and discharge current—temperature" characteristic can be represented by a correction table or a correction function. Data in the correction table or a coefficient of the correction function is stored as characteristic data in the memory 60. The operation processing part 50 performs a correction of the charge and discharge current value in accordance with a temperature measured by the temperature detecting part 10.

On the other hand, when a charge and discharge of the secondary battery 200 is in a stop state (for example, an operation of the portable equipment 300 is stopped or in a standby state) the charge and discharge current value becomes smaller as compared to that of the charge state or discharge state. As a result, when a state where a large amount of error continues due to a measurement by the current detecting part 30 or the ADC 40 for a reason relating to a resolution, etc., or a state where a measurement cannot be performed continues for a fixed period, an error in the process of the above-mentioned current integration is accumulated, which deteriorates accuracy in the computation of the remaining amount of charge. In order to prevent the deterioration, the operation processing part 50 may stop the integration process of the current value, or store a previously measured current consumption value of the portable equipment 300 in the memory 60 and integrate the stored value.

Figure 2:
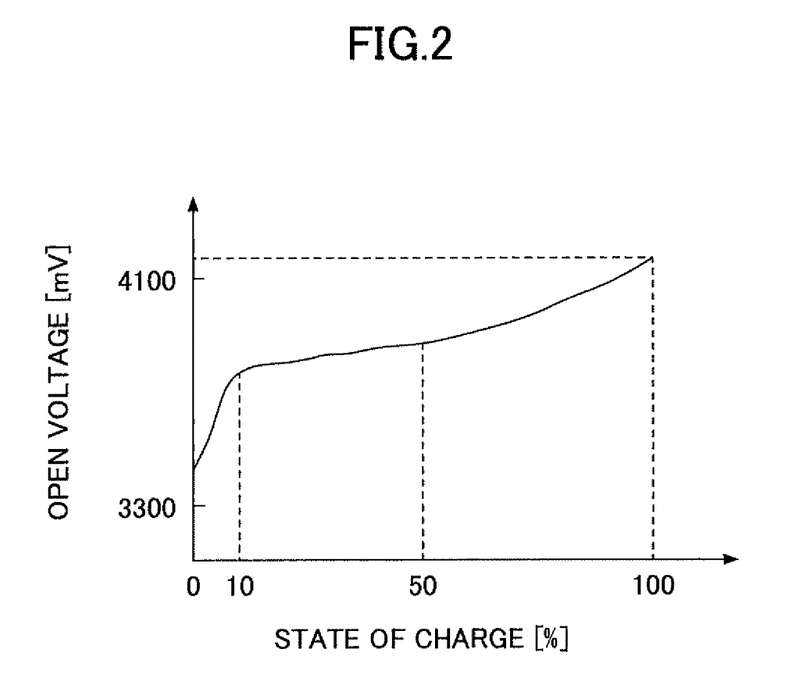
FIG. 2 is an illustration indicating an "open voltage—state of charge" characteristic at 25° C.

Moreover, in order to raise the operation accuracy of the remaining amount of charge or a state of charge, the operation processing part 50 measures, when the stopped state of the portable equipment 300 continues for a predetermined time, periodically measures a voltage (open voltage) of the secondary battery 200 and computes and corrects the state of charge based on the "open voltage—state of charge" characteristics (refer to FIG. 2). The open voltage is a voltage across the electrodes, which is measured by opening the electrodes of the stable secondary battery 200 or measured with a high-impedance. The state of charge is a ratio of a remaining amount of charge of the secondary battery 200 represented by percentage when the full charge capacity of the secondary battery at that time is set as 100. The "open voltage—state of charge" characteristic is represented by a correction table or a correction function.

Data in the correction table or a coefficient of the correction function is stored as characteristic data in the memory 60. The operation processing part 50 performs a computation and correction of the open voltage measured by the voltage detecting part 20 in accordance with the correction table or the correction function in which the character data read from the memory 60 is reflected. Additionally, if there exists a temperature characteristic in the open voltage of the secondary battery 200, the operation processing part 50 may perform a predetermined temperature correction with respect to the open voltage.

As mentioned above, although the operation processing part 50 can compute the state of charge of the secondary battery 200, the operation processing part 50 cannot compute a remaining amount of charge of the secondary battery 200 unless the full charge capacity of the secondary battery 200 is not measured or estimated because the remaining amount of the secondary battery 200 is computed based on a relationship between the full charge capacity and the state of charge.

As a method of computing a full charge capacity of the secondary battery 200, there is a method of computing based on a discharge amount of the secondary battery 200 or computing based on a charge amount. For example, when computing based on the full charge capacity, an accurate charge current can be measured as compared to that measured based on a discharge amount, which tends to be influenced by the current consumption characteristic of the portable equipment 300 because the charge is performed with a constant voltage or a constant current if the charge is other than a pulse charge. Of course, the method to be used may be selected in consideration of the characteristics of the portable equipment 300.

Thus, the condition at which an accurate full charge capacity can be measured is a case where a charge is performed continuously for a period from a state where a remaining amount of charge is zero until a fully-charged state is reached, and the current value integrated during the charge period is the full charge capacity. However, considering a general use, such a charge is rarely performed, and, normally, a charge is performed from a state where a certain remaining amount of charge is present.

Accordingly, in consideration of such a case, the operation processing part 50 computes the full charge capacity of the secondary battery 200 based on a battery voltage at a time immediately before a start of a charge and a battery voltage at a time a predetermined time has passed after an end of the charge. That is, the operation processing part 50 computes a state of charge at the time immediately before the start of the charge based on the battery voltage at the time immediately before the start of the charge and the "open voltage—state of charge" characteristic (refer to FIG. 2), and computes a state of charge at the time a predetermined time has passed after the end of the charge based on the battery voltage at the time the predetermined time has passed after the end of the charge and the "open voltage—state of charge" characteristic (refer to FIG. 2). Then, the operation processing part 50 can compute the full charge capacity FCC of the secondary battery 200 based on the operation expression $$FCC = Q/[(SOC2-SOC1)/100] \tag{1}$$

where the full charge capacity is FCC [mAh], the state of charge at the time immediately before a start of a charge is SOC1 [%], the state of charge at a time a predetermined time has passed after an end of the charge is SOC2 [%], and an amount of electric power charged during a charge period from the charge start time to the charge end time. It should be noted that if SOC1 and SOC2 are temperature-corrected, more accurate value can be computed. Moreover, by using the battery voltage at the time a predetermined time has passed after the charge end time, the accuracy of the computation result can be raised by reflecting a battery voltage more stable than that of the charge end time in the computation.

Therefore, the remaining amount of charge of the secondary battery 200 can be computed based on the thus-computed state of charge and full charge capacity (remaining amount of charge=full charge capacity×state of charge). Moreover, it becomes possible to estimate a degree of deterioration of the secondary battery 200 by the full charge capacity being computable. The operation processing part 50 can compute a degree of deterioration SOH of the secondary battery 200 at an arbitrary time based on the operation expression $$SOH=RFCC/AFCC\times 100 \quad (2)$$

where an initial full charge capacity is AFCC and a full charge capacity at an arbitrary time is RFCC.

In the meantime, if a function of a management system of a battery system of the secondary battery 200, such as a battery remaining amount management, a deterioration diagnosis, a history management of abnormality detection, etc., is added to the battery pack 100A used by the portable equipment 300, an electric power is consumed to achieve the function to no small extent, which is a cause of reducing an amount of charge of the secondary battery 200. Thus, by the management system itself shifting to a standby mode in which a power consumption is lower than that of a normal state in association with the management system of the battery pack 100A shifting to an operation mode in which the portable equipment 300 consumes a smaller electric power than that in a normal operation mode, a consumption of energy accumulated in the secondary battery 200 can be suppressed effectively.

Figure 3:
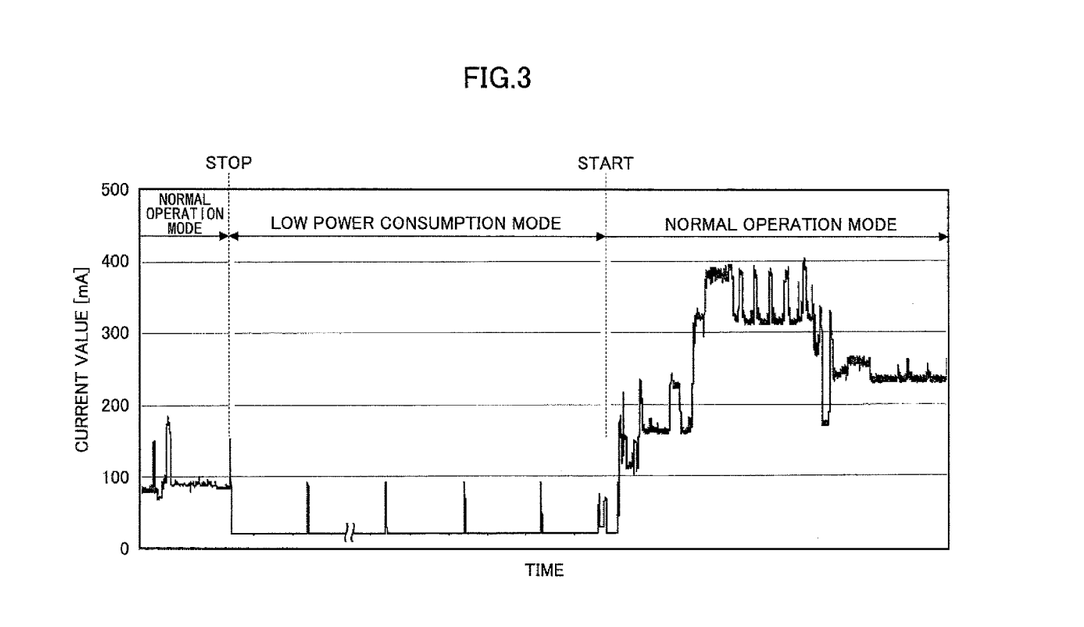
FIG. 3 is an illustration indicating a change in a current consumption of portable equipment 300.

FIG. 3 is an illustration indicating a change in a current consumption of the portable equipment 300. In order to suppress a power consumption of the portable equipment itself, the portable equipment 300 has a function which operates in a low power consumption mode in which a power consumption is lower than that in a normal operation mode. The portable equipment 300 shifts from the normal operation mode to the low power consumption mode when a condition to shift to the low power consumption mode is established in the normal operation mode. Additionally, the portable equipment 300 shifts from the low power consumption mode to the normal operation mode when a condition to shift to the normal operation mode is established in the low power consumption mode. For example, in a case where the portable equipment 300 is a cellular phone, if a standby state continues for a predetermined time, it is shifted from the normal operation mode to the low power consumption mode. If a predetermined operation input by a user is detected, it is shifted from the low power consumption mode to the normal operation mode.

The operation processing part 50 changes its own operation mode in response to a change in the operation mode of the portable equipment 300. The operation processing part 50 monitors a current consumption value of the portable equipment 300 through the ADC 40 so that if a current value, at which it is regarded that the portable equipment 300 shifted to the low power consumption mode, is detected for a fixed period, the operation processing part 50 determines that the portable equipment 300 has shifted to the low power consumption mode and shifts the operation mode of the operation processing part 50 itself from a detection mode, in which a detecting operation of a battery state of the secondary battery 200 is performed, to a standby mode, in which a power consumption is lower than that of the detection mode. In the standby mode, the operation processing part 50 stops the detecting operation of the secondary battery 200 or delays the cycle of the detecting operation. By performing an operation limitation such as a stop of the detecting operation, the power consumption of the operation processing part 50 and the ADC 40 can be reduced, and the temperature detection part 10, the voltage detecting part 20 and the current detecting part 30 can be operated to a required minimum.

The operation processing part 50 operates in the standby mode, in which the detecting operation of a battery state of the secondary battery 200 is limited, until a start-up of the portable equipment 300 is detected by the start-up current detecting part 31 (refer to FIG. 1). Further, the operation processing part 50 performs, at a predetermined return period, a temporary returning operation from the standby mode to the detection mode until a start-up of the portable equipment 300 is detected by the start-up current detecting part 31. The return period is managed by the timer 80.

The start-up current detecting part 31 detects a start-up of the portable equipment 300 from the low power consumption mode to the normal operation mode when the operation processing part 50 is in the standby mode. That is, the start-up current detecting part 31 is not limited in its operation even when it is in the standby mode. The start-up current detecting part 31 detects a start-up of the portable equipment 300 by the start-up current, which is generated in association with the start-up of the portable equipment 300 being detected by the detection resistor 30a. The start-up current detecting part 31 sends a return signal (interrupt signal) to the CPU 51 when a current exceeds a current threshold value, which is needed to detect a start-up current. Upon reception of the return signal, the CPU 51 shifts from the standby mode to the detection mode, and restarts the detecting operation of the secondary battery 200. If the tendency of change in the current consumption of the portable equipment 300 is the case as illustrated in FIG. 3, the current threshold value for detecting the start-up current may be set to, for example, 200 mA. Because the start-up current rises while the current value thereof fluctuates, hysteresis may be provided to the current threshold value for detecting the start-up of the portable equipment 300.

The operation processing part 50 detects a battery state of the secondary battery 200, such as a remaining amount of charge, a state of charge or an occurrence of abnormality, by detecting a temperature, a voltage and a current of the secondary battery 200 during the return period where the mode is temporarily shifted from the standby mode to the detection mode. The operation processing part 50 shifts from the detection mode to the standby mode after the temporary detection of the battery state of the secondary battery 200 is completed. As mentioned above, if the time period of the operation processing part 50 being set in the standby mode becomes long due to elongation of the period of the low power consumption mode of the portable equipment 300 by spontaneously and temporarily returning to the detecting mode (due to the start-up of the portable equipment 300 not being detected), the state where the detecting operation of the battery state is not performed is prevented from being continued for a long time, which suppresses deterioration in the accuracy of detection of the battery state.

The operation processing part 50 performs, in a temporary return period, a first remaining amount correction process for computing a remaining amount of charge in the present return period by subtracting an amount of charge corresponding to a value, which is a multiplication of a current consumed by the portable equipment 300 in the low power consumption mode and a standby time during which the operation processing part 50 operates in the standby mode, from a remaining amount of charge computed in the detection mode. That is, the multiplication value, which is acquired by multiplying the current consumption value of the portable equipment 300 in the low power consumption mode by the standby time during which the operation processing part 50 is in the standby mode between a last return period and a present return period, is subtracted from an amount of change computed in the detection mode during the last return period.

In order to compute a remaining amount of charge, when the operation processing part 50 shifts from the detection mode to the standby mode in association with the portable equipment 300 shifting from the normal operation mode to the low power consumption mode, in the detection mode during a first return period in the standby mode, the remaining amount of charge in the first return period is computed by subtracting a multiplication value, which is acquired by multiplying the current consumption value consumed by the portable equipment in the low power consumption mode by the period from a time at which it shifts to the low power consumption mode to the time at which the first return period begins.

The current value consumed by the portable equipment 300 in the low power consumption mode is previously stored in the memory 60. Because the current consumption in the low power consumption mode is substantially constant as illustrated in FIG. 3, the current value can be previously stored in the memory 60 with a small memory capacity. If the type or specification of the portable equipment 300 is changed, it can deal with such a change by rewriting the stored information in the memory 60.

Alternatively, the current consumption value may not be previously stored in the memory 60 but may be actually measured. Because the start-up current detecting part 31 measures a current in the standby mode and the detection accuracy of the current consumption in the low power consumption mode of the portable equipment 300 is raised by using the actually measured value, the detection accuracy of the battery state such as a remaining amount of charge or the like can be raised.

Further, the operation processing part 50 performs, during a temporary return period, a second remaining amount correction process to compute a remaining amount of charge at the present return period by detecting or computing an ambient temperature, an open voltage, a state of charge, a full charge capacity, a degree of deterioration, etc., of the secondary battery 200 by using the characteristic illustrated in FIG. 2 as mentioned above. By performing the first remaining amount correction process and the second remaining amount correction process in combination, an accurate computation result can be obtained.

Because the first remaining amount correction process is a correction process in which an error associated with passage of time tends to be accumulated as compared to the second remaining amount correction process, the return period of the second remaining amount correction process is set longer than the return period of the first remaining amount correction process (for example, the return period of the first remaining amount correction period is set to a value between 1 second to 1 hour, and the return period of the second remaining amount correction process is set to a value between 1 hour to 3 hours). That is, the first remaining amount correction process bears a short-period correction of the result of computation of a remaining amount of charge, and the second remaining amount correction process bears a long-period correction of the result of computation of a remaining amount of charge.

Figure 4A:
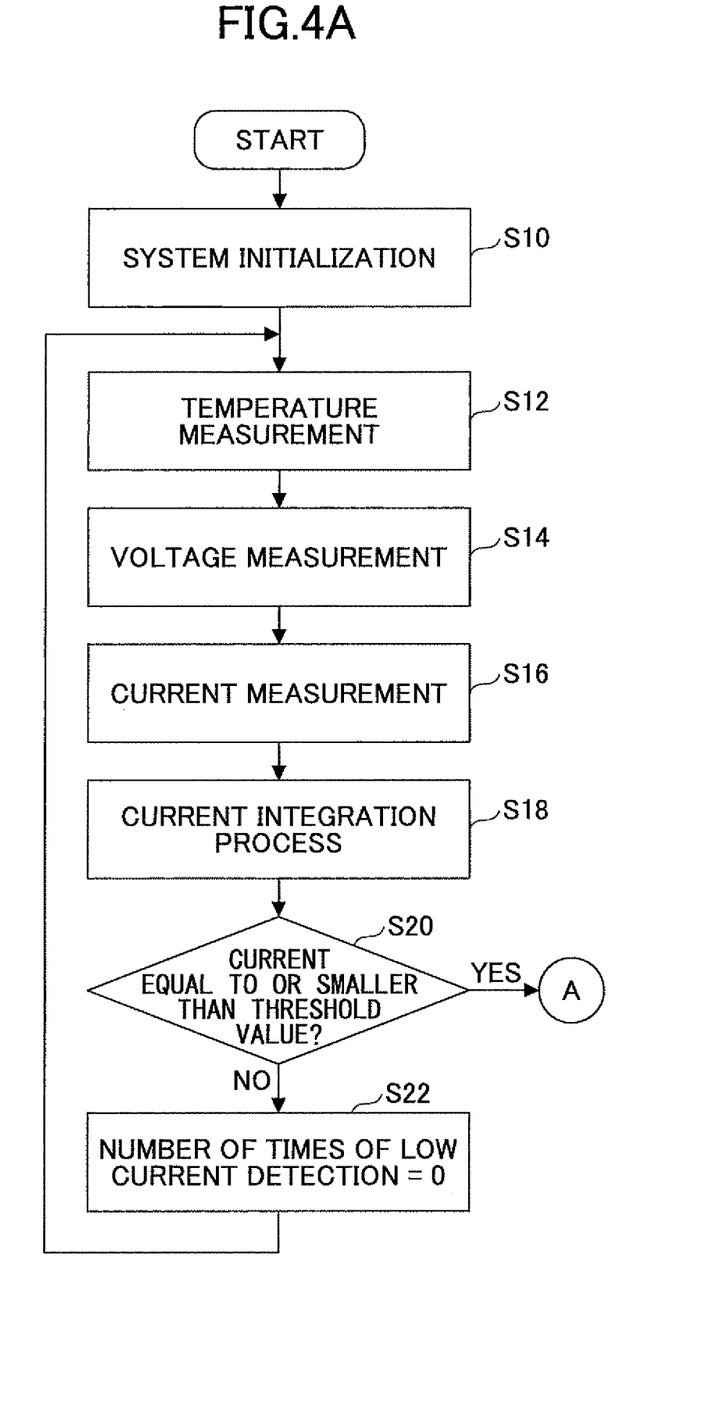
FIG. 4A is an operation flowchart of a management system in the battery pack 100A.
Figure 4B:
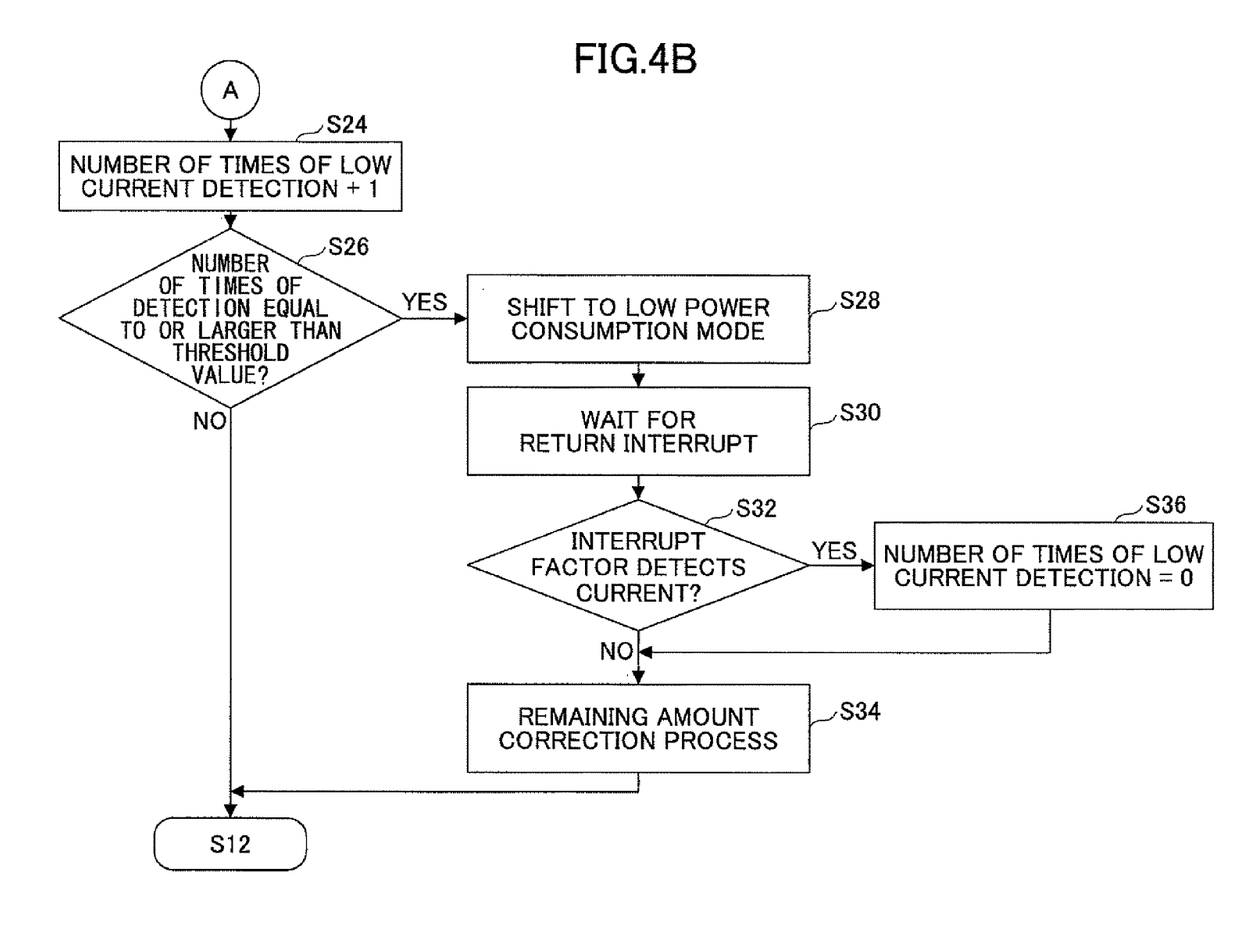
FIG. 4B is an operation flowchart of the management system in the battery pack 100A.

FIGS. 4A and 4B are operation flowcharts of the management system in the battery pack 100A. The management system operates with the operation processing part 50 serving as a main part. After initialization of the management system (step 10), the operation processing part 50 performs a temperature measurement by the temperature detecting part 10 (step 12), a voltage measurement by the voltage detecting part 20 (step 14), and a current measurement by the current detecting part 30 (step 16). Additionally, the operation processing part 50 performs a current integration process (step 18).

The operation processing part 50 judges whether the current consumption of the portable equipment 300 is equal to or smaller than predetermined current threshold value based on these measurement results and processing results (step 20). If it is not equal to or smaller than the predetermined current threshold value, the operation processing part 50 assumes that the portable equipment 300 is in the normal operation mode and a flag of the number of times of low current detection is set to zero (step 22) to repeat the operation of step 12 and the subsequent steps. On the other hand, if it is equal to or smaller than the predetermined current threshold value, the flag of the number of times of low current detection is incremented (step 24).

The operation processing part 50 judges whether the value of the flag of the number of times of low current detection is equal to or larger than a predetermined threshold value for number of times (step 26). If it is not equal to or larger than the number of times threshold value, it is regarded that the number of times of low current detection is less than the threshold value for number of times and the operation of step 12 and subsequent steps is repeated. If it is equal to or larger than the threshold value for number of times, it is judged that the portable equipment 300 shifted to the low power consumption mode and the setting mode of its own is shifted from the detection mode to the standby mode (step 28). That is, a period from a detection of reduction in the current consumption of the portable equipment 300 until the setting mode of the operation processing part 50 is shifted from the detection mode to the standby mode is maintained to be equal to or longer than a fixed time. Thereby, an erroneous judgment that the portable equipment 300 shifted the low power consumption mode is prevented from being made even when the portable equipment 300 did not shift to the low power consumption mode but the current consumption of the portable equipment 300 merely decreased.

The operation processing part 50 waits for interrupt of a return signal from the start-up current detecting part 31 in the standby mode (step 30). If a cause of interrupt is not a detection of a start-up current, the process proceeds to step 34. That is, if a cause of the interrupt is not a spontaneous return responding to the above-mentioned return period, the operation processing part 50 performs the above-mentioned first or second remaining amount correction process (step 34) without changing the flag value of the number of times of low current detection in order to repeat the operation of step 12 and subsequent steps. On the other hand, if a cause of the interrupt is a return signal from the start-up current detecting part 31 in association with a start-up of the portable equipment 300, the operation processing part 50 sets the flag of the number of times of low current detection is set to zero (step 36) and performs the above-mentioned first or second remaining amount correction process (step 34) in order to repeat the operation of step 12 and subsequent steps.

Thus, according to the above-mentioned embodiment, there is no need to always maintain the operation processing part 50 and the ADC 40, which are main parts of the management system, in the detection mode by providing the start-up current detecting part 31, which can be configured by a simple circuit to detect a start-up current, and a consumption of a remaining amount of charge of the secondary battery 200 by the management system, which manages the battery status of the secondary battery 200. Additionally, because the battery state can be detected, even when the portable equipment 300 is not started-up, by returning intermittently from the standby mode to the detection mode, the detection accuracy is prevented from being deteriorated due to nondetection of the battery state while taking an advantage of the reduction in the power consumption by setting to the standby mode.

Although the preferred embodiment is explained above, the present invention is not limited to the above-mentioned embodiment, and various variations and modifications may be made without departing from the scope of the present invention.

Figure 5:
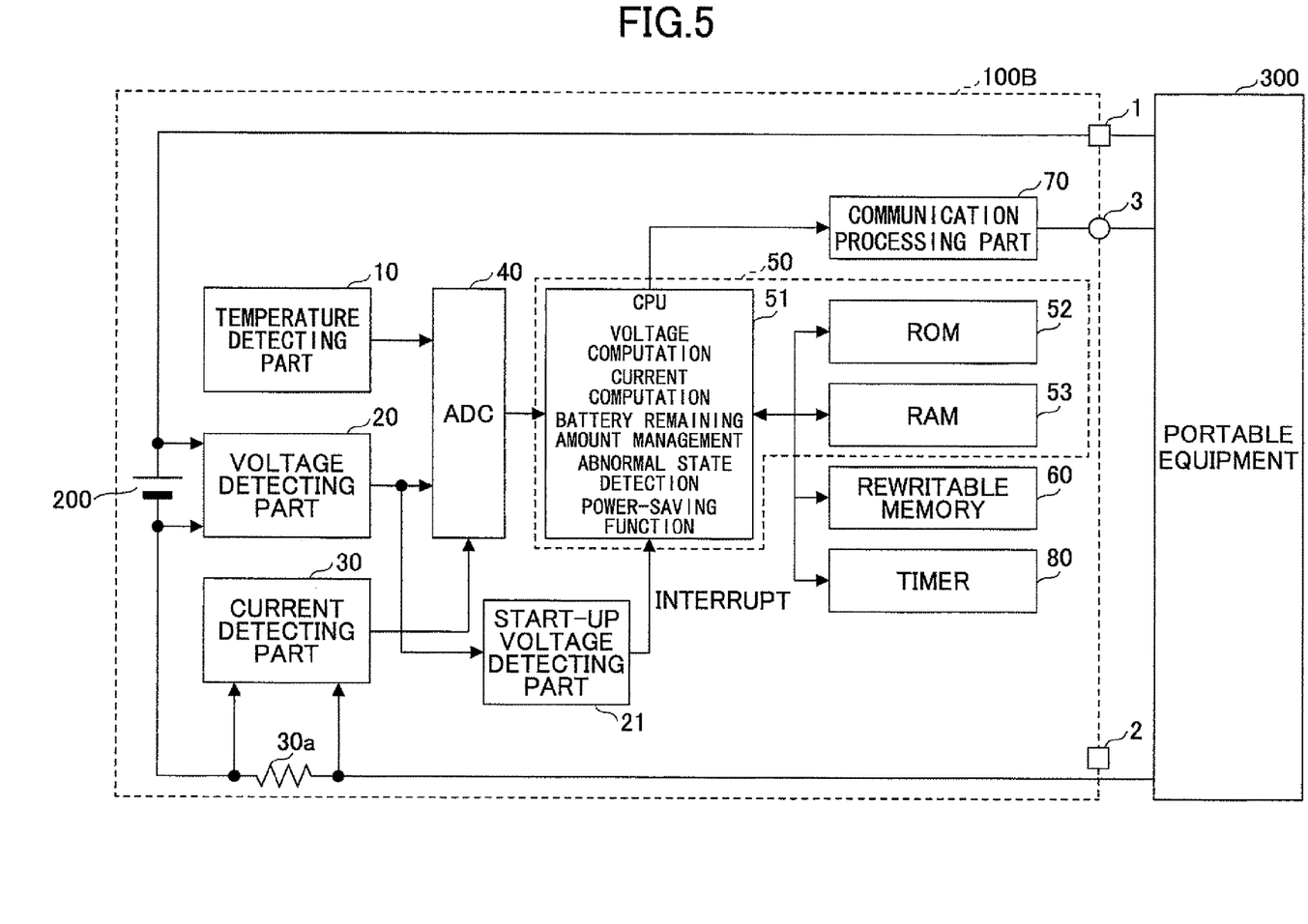
FIG. 5 is an overall structure diagram of an intelligent battery pack 100B, which is a second embodiment of the battery-state monitoring apparatus according to the present invention.

For example, FIG. 5 is an overall structure diagram of an intelligent battery pack 100B, which is a second embodiment of the battery state monitoring apparatus according to the present invention. Descriptions of parts which are the same as parts of the battery pack 100A will be omitted.

The battery pack 100B performs a detection of a start-up of the portable equipment 300 not by a detection of a start-up current as in the battery pack 100A, but a detection of a start-up voltage. If a relatively large start-up current flows in the portable equipment 300, a voltage drop corresponding to "multiplication value of the start-up current and an internal resistance" is generated because there is an internal resistance in the secondary battery 200. Thus, it can be determined that the portable equipment 300 was started-up when the start-up voltage detecting part 21 detects the voltage drop. The start-up voltage detecting part 21 sends a return signal (interrupt signal) to the CPU 51 when a current causing a voltage to exceed a voltage threshold value, which is necessary for detecting a start-up voltage, flows. Upon reception of the return signal, the CPU 51 shifts from the standby mode to the detection mode and restarts the detecting operation of the secondary battery 200.

Alternatively, the operation processing part 50 may perform a detection of a start-up of the portable equipment 300 by receiving a start-up signal from the portable equipment 300 through the communication processing part 70. The portable equipment 300 outputs the start-up signal, which represents that the portable equipment itself has been started-up, and the operation processing part 50 judges whether the portable equipment 300 has been started-up based on the start-up signal. The portable equipment 300 outputs the start-up signal of an H-level when it is in the normal mode, and outputs the start-up signal of an L-level when it is in the low power consumption mode.

The present application is based on Japanese priority application No. 2008-181923 filed on Jul. 11, 2008, the entire contents of which are hereby incorporated herein by reference.

EXPLANATION OF REFERENCE NUMERALS 10 temperature detecting part
20 voltage detecting part
21 start-up voltage detecting part
30 current detecting part
31 start-up current detecting part
40 ADC
50 operation processing part
60 memory
70 communication processing part
80 timer
100A, 100B battery pack
200 secondary battery
300 portable equipment

The invention claimed is:

1. A battery-state monitoring apparatus, comprising:
a secondary battery supplying an electric power to an electric load; and
a state detecting part detecting a battery state of said secondary battery by being supplied with a power from said secondary battery, said state detecting part being set in one of a detection mode to detect a battery state of said secondary battery and a standby mode in which a power consumption of said state detecting part is smaller than said detection mode such that said state detecting part is intermittently set in the detection mode in a return period; and, the state detecting part using said secondary battery as a power source,
wherein said battery-state monitoring apparatus includes a start-up detecting part detecting a start-up of said electric load;
wherein, when a number of times of determination, which indicates that a current value consumed by said electric load is smaller than or equal to a predetermined current value, is larger than or equal to a predetermined threshold value, said state detecting part waits for a detection of said battery state in a standby mode until said start-up is detected by said start-up detecting part; and
wherein said state detecting part
performs, during said return period that occurs at a first interval, a first remaining amount correction process where a remaining amount of charge of said secondary battery is calculated by subtracting, from said remaining amount of charge detected in said detection mode prior to said return period, a value obtained by multiplying a predetermined current consumption value, which is consumed by said electric load in said standby mode, by a standby time indicating duration of said standby mode after the detection mode, and
performs, during said return period that occurs at a second interval, a second remaining amount correction process where the remaining amount of charge of said secondary battery is calculated based on an open voltage of said secondary battery, the second interval being longer than the first interval.

2. The battery-state monitoring apparatus as claimed in claim 1, wherein the current consumption value of said electric load is stored in a memory.

3. The battery-state monitoring apparatus as claimed in claim 1, wherein, in association with the start-up of said electric load, said start-up detecting part detects as said start-up a fluctuation in a current generated in a power supply path between said electric load and said secondary battery, and also detects the current consumption value of said electric load.

4. The battery-state monitoring apparatus as claimed in claim 1, wherein, in association with the start-up of said electric load, said start-up detecting part detects as said start-up a fluctuation of a current or a voltage generated in a power supply path between said electric load and said secondary battery, and also detects the current consumption value of said electric load.

* * * * *